United States Patent [19]

Charles et al.

[11] Patent Number: 4,684,446
[45] Date of Patent: Aug. 4, 1987

[54] SECONDARY METALLIZATION BY GLASS DISPLACEMENT IN CERAMIC SUBSTRATE

[75] Inventors: Richard J. Charles, Schenectady; Stephan P. Mitoff, Clifton Park; Wayne D. Pasco, Scotia, all of N.Y.

[73] Assignee: General Electric Company, Schenectady, N.Y.

[21] Appl. No.: 780,137

[22] Filed: Sep. 26, 1985

[51] Int. Cl.$^4$ ............................................. H05K 3/10
[52] U.S. Cl. ..................................... 204/15; 204/37.1; 204/38.4; 204/38.6; 427/96; 427/98; 427/376.3; 427/383.5
[58] Field of Search ....................... 204/38.4, 39, 37.1, 204/15, 38.6; 427/376.2, 376.3, 96, 98, 123, 125, 383.5; 29/851

[56] References Cited

U.S. PATENT DOCUMENTS

| | | | |
|---|---|---|---|
| 3,352,007 | 11/1967 | Charles | 29/599 |
| 4,206,254 | 6/1980 | Schmeckenbecher | 427/259 |
| 4,340,618 | 7/1982 | Fury et al. | 427/376.3 |
| 4,430,690 | 2/1984 | Chance et al. | 361/321 |
| 4,442,137 | 4/1984 | Kumar | 427/57 |
| 4,471,004 | 9/1984 | Kim | 427/88 |
| 4,510,000 | 4/1985 | Kumar et al. | 156/89 |

OTHER PUBLICATIONS

Frederick et al., The Review of Scientific Instruments, vol. 40, No. 9, 1240–1241 (Sep., 1969).
Technical Notes, A Publication of RCA/Princeton, N.J., TN No. 907 (1972)–L. L. Trager.
Schwartz & Wilcox, "Laminated Ceramics", Proceedings Electronic Components Conference, 1967, pp. 17–26.

*Primary Examiner*—John F. Niebling
*Assistant Examiner*—William T. Leader
*Attorney, Agent, or Firm*—Jane M. Binkowski; James C. Davis, Jr.; Paul R. Webb, II

[57] ABSTRACT

A process for increasing electrical conductance of a metallization on a ceramic substrate wherein the metallization is an intermixture of continuous phases of refractory metal and glass which comprises contacting the refractory metal with an electrically conductive intrusion metal and heating the resulting structure to a temperature at which the glassy phase is fluid, the refractory metal is solid, and the intrusion metal is liquid whereby the liquid metal preferentially wets the refractory metal, migrates into the metallization displacing glass and, upon subsequent solidification, partially or wholly occupies the volume space originally containing the continuous glass phase.

18 Claims, No Drawings

SECONDARY METALLIZATION BY GLASS DISPLACEMENT IN CERAMIC SUBSTRATE

This invention relates to a secondary metallization of a premetallized cofired ceramic device by the selective displacement of glass in the premetallization with a metal. More specifically, this invention is directed to increasing the electrical conductance of conventional laminated and surface refractory metal (i.e. W, Mo) metallizations (i.e. buried, interlayer interconnect traces and vias, die-pads and surface traces, bond pads, finger and braze attachment pads, seal rings, etc.) of ceramic devices, particularly integrated circuit chip carriers.

The thick film circuitry of a ceramic substrate is limited in performance by the conductivity of the metal patterns. Generally, the conductive passageways, i.e. metal patterns, are comprised of a refractory metal such as tungsten and glass and usually contain voids. Only the metal particles contribute to the electrical conductivity. If the glass and voids were replaced by a metal such as copper, the electrical conductivity could be increased substantially.

An object of this invention is to increase the conductivity of ceramic chip carriers of the present design without significantly changing production process and cost.

Briefly stated, the present process for significantly increasing the electrical conductance of a metallization on a ceramic substrate comprises providing a ceramic substrate with an adherent electrically conductive refractory metal metallization wherein at least one portion of said metallization is exposed, said metallization being comprised of an intermixture of a continuous phase of refractory metal and a continuous phase of glass, said refractory metal ranging from about 25% by volume to about 65% by volume of said metallization, contacting said refractory metal at at least one exposed portion of said metallization with an intrusion metal selected from the group consisting of copper, nickel, tin, gold, iron, cobalt, and alloys thereof, heating the resulting structure to an infiltration temperature which is above the transition temperature of said glass and at which said intrusion metal is liquid but said refractory metal is solid thereby infiltrating said liquid intrusion metal into said metallization, at said infiltration temperature said liquid metal preferentially wetting said refractory metal displacing said glass with said intrusion metal, and allowing the resulting structure to cool thereby solidifying said infiltrated liquid intrusion metal in place, said solid infiltrated intrusion metal at least partly occupying the volume space originally occupied by said displaced glass and being in contact with said refractory metal phase, said process being carried out in an atmosphere or vacuum which has no significant deleterious effect on said ceramic substrate, said refractory metal metallization and said intrusion metal.

In carrying out the present process, there is provided a monolithic body or structure which is in the solid state and which is comprised of a single or multilayered ceramic substrate with an adherent electrically conductive refractory metal metallization wherein at least a portion of the metallization is exposed to the ambient. The monolithic body can be a conventional single or multilayered ceramic chip carrier comprised of liquid phase sintered alumina with a sintered refractory metal metallization.

The monolithic body can be produced by a number of conventional techniques. For example, in the fabrication of a multilayer structure, a number of thin green sheets generally composed of ceramic powder, a sufficient amount of glass forming components to enable liquid phase sintering of the ceramic at a temperature below the melting point of the refractory metal, and organic binder can be formed in a conventional manner. A paste or ink of the refractory metal particles usually suspended in organic binder and solvent can be printed in a preselected pattern on the sheets. Generally, the refractory metal particles range in size from about 5 microns up to about 20 microns. Frequently, the ink or paste contains glass forming components which, after sintering, results in a glassy phase intermingled with the continuous phase of sintered metal particles. Vias or feedthrough holes may be punched in the sheets as required for layer interconnection and filled with a paste containing the refractory metal particles. The sheets can be stacked together, i.e. superimposed on each other, in a preselected manner forming a sandwich. The stack is laminated under a pressure and temperature determinable largely by its particular composition to form a laminated structure which is then sintered. During sintering, i.e., cofiring, the ceramic powder is liquid phase sintered producing a ceramic substrate of desired density, and the refractory metal particles are sintered together producing a continuous electrically conductive phase. During sintering, a portion of the liquid glassy phase which aids sintering of the ceramic migrates into the interstices between the sintering refractory metal particles by capillarity resulting in a glassy phase intermingled with the continuous phase of refractory metal.

In the present invention, the sintered ceramic body or substrate can be any ceramic composition which can be liquid phase sintered at a temperature below the melting temperature of the refractory metal it supports during sintering. In the present process, the ceramic substrate is non-reactive with the refractory and intrusion metals. Representative of useful ceramics is alumina, aluminum nitride, mullite-cordierite composites and silicon nitride. The ceramic contains a glassy phase, which generally is continuous, in an amount of at least about 1% by volume, and frequently ranging from about 1% by volume to about 15% by volume of the ceramic body or substrate. Generally, the ceramic substrate contains pores which frequently range from about $5\mu$ to about $25\mu$ in diameter. Generally, the pores are present in an amount of at least about 1% by volume, and frequently from about 1% by volume to about 10% by volume, of the ceramic substrate. Generally, the ceramic substrate is in the form of a flat plate, i.e. it generally has a pair of opposite surfaces or faces which are flat.

The refractory metal can be any metal whose particles can be sintered together during sintering of the ceramic to produce a continuous electrically conductive phase. The refractory metal must be a solid during sintering of the ceramic, and preferably, it is tungsten or molybdenum. In the present process, the refractory metal should not react with the ceramic substrate or with the intrusion metal.

The sintered refractory metal metallization on or in the ceramic substrate provided in the present process is comprised of an intermixture of a continuous phase of sintered refractory metal particles, a continuous phase of glass and frequently isolated crystals of ceramic which, dependent on application, can range from 0 to 30% of the volume of the metallization. In the present process there should be no reaction between any of the components of the refractory metal metallization. Representative of these ceramic crystals is aluminum oxide. The present continuous phase of sintered metal particles contains interstices between at least a significant number of the particles. Generally, more than 35% by volume and less than 75% by volume of the metallization contains interstices between the particles of continuous metal phase. Generally, most of these interstices contain glass in a significant amount and frequently they are filled with glass. Also, the interstices may contain ceramic crystals in a significant amount. For those cases where the interstices are not completely filled with glass and ceramic crystals the residual interstice volume is void. The refractory metal metallization may be bonded or adhered to the ceramic substrate partly by a direct bond between the refractory metal particles and the ceramic and partly by glass or by glass alone. At least a portion of the refractory metal metallization is exposed to the ambient so that a direct contact can be made between the refractory metal and the present intrusion metal. Generally, refractory metal metallization is present on at least one external surface or face of the ceramic substrate, and usually it is present on both of the external opposite surfaces or faces of the ceramic substrate as well as passing through or being contained in the substrate. Generally, the refractory metal metallization ranges in thickness from about 10 microns to about 30 microns. In the present process, the continuous refractory metal phase retains its continuity.

The present intrusion metal is selected from the group consisting of copper, nickel, tin, gold, iron, cobalt and alloys thereof. The intrusion metal can be contacted with the refractory metal metallization by a number of conventional techniques which would provide a direct contact with at least a portion of the refractory metal. For example, a foil of the intrusion metal can be placed, i.e. deposited, on the metallization. Also, the intrusion metal can be electroplated or electroless plated onto the metallization. In addition, an ink of the intrusion metal, i.e. generally comprised of a suspension of particles of the intrusion metal in an organic medium, can be deposited, usually by screening, on the metallization. In another technique, the refractory metal can be contacted with the intrusion metal so that at infiltration temperature a pool of the liquid intrusion metal forms and its migration onto the refractory metal is by capillarity. If desired, only a portion or all of the metallization can be contacted with the intrusion metal. Preferably, the intrusion metal is contacted with the refractory metal metallization only on one side or face of the ceramic substrate thereby providing better control of the infiltration. The intrusion metal can be contacted with or deposited on the refractory metal metallization in the amount desired for infiltration. During infiltration, the intrusion metal should not dissolve, or should not dissolve to any significant extent, in the refractory metal, and it should not react, or not react to any significant extent, with the refractory metal. Specifically, in the present process, the intrusion metal should not react with any of the components of the refractory metal metallization or the ceramic substrate, and it should not dissolve, or not dissolve to any significant extent, in any of the components of the refractory metal metallization or the ceramic substrate. Also, during infiltration, the intrusion metal should not form a stable oxide.

The resulting structure is heated to infiltration temperature which is above the transition temperature of the phase of glass of the metallization and at which the intrusion metal is liquid. Above its transition temperature, glass has a viscosity of less than $10^{13}$ poises and it is fluid. At infiltration temperature, the liquid metal preferentially wets the continuous refractory metal phase thereby migrating into and through the metallization displacing the fluid glass in at least a significant amount and leaving at least a significant amount of the intrusion metal. As it migrates on the continuous phase of sintered refractory metal particles, the liquid intrusion metal displaces glass in the interstices between the particles leaving intrusion metal therein and usually filling any voids therein.

The particular infiltration temperature depends on the particular composition of the glass and on the melting point or liquidus of the intrusion metal. Generally, the infiltration temperature ranges from higher than about 1300° C. to less than about 1550° C. Generally, the rate of infiltration increases with increasing infiltration temperature. At infiltration temperature the refractory metal is a solid. Also, preferably, at infiltration temperature there should be no significant vaporization of the intrusion metal. The infiltration temperature should have no significant deleterious effect on the ceramic substrate or on the refractory and intrusion metals.

During the present infiltration, the glassy phase in the ceramic substrate is above its transition temperature and liquid but the ceramic is solid thereby converting the substrate to a plastic state. However, in the present process, the monolithic body or structure comprised of the ceramic substrate with adherent metallization will not sag, or will not sag significantly, unless it is supported significantly or substantially unevenly. In one embodiment of the present process, the structure comprised of the ceramic substrate with adherent metallization is supported by support means which would prevent any significant distortion or deformation of the structure. For example, a flat surface or face of the structure or ceramic substrate can be supported on a flat surface of a support means and such support means may be horizontal or substantially vertical. The surface comprised of a flat surface or face of a ceramic substrate with adherent metallization thereon may be considered flat since the metallization ordinarily is too thin to have any significant effect on flatness. However, in those cases where sticking between the metallization and the support means might occur, flat pieces of the support means of the same thickness can be placed to contact and support the ceramic substrate but not touch its metallization and such support can be significantly or substantially even to prevent sagging, or any significant sagging of the structure of substrate. Also, the support means can be configured to support a sufficient portion of the edge surface of a ceramic substrate in a substantially vertical manner so that there is a downward force on all its weight which prevents it from sagging or sagging significantly.

In another embodiment of the present process, controlled deformation of the structure comprised of the ceramic substrate with adherent metallization can be carried out if the infiltration is carried out for a long enough time, determinable empirically, to produce a product for specific applications such as, for example, the preparation of spherical or paraboloid concave surfaces for the mounting and interconnection of integrated opto-electronic devices. In such instance, for example, a structure in the form of a flat or substantially flat plate, i.e. a ceramic substrate with adherent metallization, would be supported on support means having the configuration which is to be imparted to the structure or ceramic substrate while the substrate is in a plastic state.

The support means should have no significant deleterious effect in the present process, i.e. it should be inert or substantially inert in the present process. Specifically, it should not react with the ceramic substrate, or with the refractory metal metallization or with the intrusion metal. Representative of such support means are metal oxides such as aluminum oxide and refractory metals such as tungsten and molybdenum.

The present process is carried out in an atmosphere or vacuum in which the ceramic substrate and refractory and intrusion metals are inert or substantially inert, i.e. an atmosphere or vacuum which has no significant deleterious effect on thereon. Specifically, the atmosphere or vacuum should be nonoxidizing with respect to the refractory and intrusion metals and the ceramic substrate. Preferably, the process is carried out in a dry atmosphere or vacuum, i.e. an atmosphere or vacuum having a dew point of at least 0° C. or lower. Representative of a useful atmosphere is nitrogen, hydrogen, a noble gas, preferably argon, and mixtures thereof. Preferably, a reducing atmosphere containing at least about 1% by volume of hydrogen, and more preferably at least about 5% by volume of hydrogen, is used to insure maintenance of sufficiently low oxygen partial pressure. Preferably, the atmosphere is at ambient pressure.

Upon completion of the infiltration, the resulting structure is allowed to cool thereby solidifying the infiltrated liquid intrusion metal in place and also solidifying the glass making the structure a solid. Preferably, it is cooled to ambient temperature. The rate of cooling can vary and is not critical, but it should have no significant deleterious effect on the structure. Preferably, it is furnace cooled to ambient temperature.

The period of time at infiltration temperature can vary depending largely on the particular infiltration temperature and the extent of infiltration desired. Generally, however, the time at infiltration temperature ranges from about 30 minutes to less than an hour.

Generally, during infiltration, the displaced fluid glass is pushed into the pores of the ceramic substrate which are next to or close to the metallization. When there are no substrate pores close to the metallization, or when these pores become filled with glass, the fluid glass usually is pushed to the surface of the metallization leaving small beads or bumps of glass thereon which ordinarily can be seen only under a microscope. These beads or bumps of glass can be left on the metallization or, if desired, they can be removed in a conventional manner by light abrasion, laser tools or by chemical means.

As a result of the present infiltration, at least a sufficient amount of infiltrated intrusion metal is left in direct contact with the refractory metal to increase the electrical conductance of the refractory metal phase by at least a significant amount. Specifically, the infiltrated intrusion metal solidifies in place in contact with the refractory metal and occupies partially or wholly the volume space originally occupied by the displaced glass phase in the metallization. The amount of intrusion metal infiltrated into and/or through the refractory metal metallization can be controlled as desired. As a result of the present process, intrusion metal is left in the interstices of the refractory metal phase in contact with the refractory metal. Also, intrusion metal may at least partly bond the refractory metal phase to the substrate and may coat the refractory metal phase. Preferably, the infiltration is controlled to prevent significant build-up of intrusion metal on an external surface of the metallization which would affect its thickness significantly. The extent of infiltration can be determined by a number of techniques. For example, it can be determined empirically by determining the change in electrical resistance or conductivity of the infiltrated metallization. Also, observation of substantial color change in the refractory metal phase during infiltration may indicate that the intrusion metal is close to coating or building up on the refractory metal phase.

Since the intrusion metal follows the path that an electric current will follow, a preselected portion of that path can be infiltrated by using substantially the same techniques which would interrupt a current. For example, by interrupting a connection in a refractory metal metallization, only a portion of that metallization will be infiltrated by the intrusion metal. Also, if a refractory metal metallization has one special contact point, such contact point can be covered with an insulator so that the intrusion metal will not contact that point and infiltration of that metallization will not occur from that point.

The present process is preferably carried out to leave the infiltrated intrusion metal in contact with the refractory metal phase in at least a sufficient amount, i.e. to at least a sufficient extent, to produce a product having an electrical conductance which is at least about 10% higher, preferably at least about 50% higher, and more preferably at least about 100% higher than that of the non-infiltrated piece.

The present process produces a product which has a number of uses. The product can be brazed via the metallization to another metallic part making it useful as a socketed, or leaded device as part of an integrated circuit. Also, the infiltrated metallization, after being plated initially with nickel and then with gold as is conventionally done in the production of chip carriers to prevent oxidation of the metallization, could have wires diffusion bonded thereto making the product useful as a chip carrier in computers.

The invention is further illustrated by the following examples wherein the procedure was as follows unless otherwise stated:

A molybdenum furnace was used.

As used herein, the footprint side or face of the substrate is opposite the top face of the substrate, i.e. the surface to which the silicon chip would be bonded.

The heating rate to the soak temperature, i.e. the infiltration temperature, was about 3 hours to temperature.

All of the examples were carried out in an atmosphere at ambient pressure.

In Examples 1 and 6–16, the dry atmosphere was comprised of a mixture of about 10% by volume hydrogen and about 90% by volume argon, and it was estimated to have a dew point of 0° C. or lower.

In Examples 1–10, the wet atmosphere was comprised of a mixture of about 10% by volume hydrogen and about 90% by volume argon, and the mixture was saturated with water at room temperature.

In Examples 1–17, before being placed in the furnace, each sample was placed on support means so that a face of the sample was substantially evenly supported. The support means was comprised of a high alumina ceramic comprised of 99% by volume alumina. Between a plaque of the supporting ceramic and each sample, there was placed flat pieces of the same thickness of the same ceramic so that there was no contact between the metallization and the ceramic support.

EXAMPLE 1

In Table I, Sample Type A was a co-fired, multilayered ceramic chip carrier, about 0.4 inch square and about 0.1 inch thick. It was comprised of a high alumina ceramic substrate with adherent, electrically conductive tungsten metallization on both the footprint and top surfaces, and also in its vias and interconnects. The ceramic substrate was constructed of five layers and was comprised of about 87% by volume alumina, about 11% by volume glass and about 4% by volume porosity. The pores appeared to range from about 10 microns to about 20 microns in diameter and were distributed throughout the substrate. A significant number of these pores were present in the external surface portion of the ceramic substrate next to the metallization. The metallization was about 12.5 microns thick and was comprised of an intermixture of continuous phases of tungsten and glass. The metallization was comprised of about 60% to 65% by volume tungsten and the balance was glass, and it may have contained some pores but they were not observed. It had 24 independent circuits between the pads on the footprint and their counterparts on the top side of the ceramic substrate. The average measured resistance of the metallization before infiltration for sample Type A as measured between one of the pads on the footprint and its counterpart on the top side of the ceramic substrate was determined to be 160 milliohms.

The copper ink was comprised of finely comminuted copper particles in an organic vehicle containing copper in an amount of about 50% by volume of the ink. The copper ink was coated on the exposed metallization on the footprint side of the substrate only and dried in air leaving a coating thereon about 1 mm thick. The copper particles were in direct contact with at least a portion of the tungsten metal.

The resulting structure was placed on supporting means and heated in the dry atmosphere up to a soak temperature of 1450° C., and during this heating the organic residue from the ink decomposed leaving elemental copper. Upon reaching 1450° C., the wet atmosphere was substituted for the dry atmosphere, and the sample was held at 1450° C. for 30 minutes. It was then furnace-cooled in the wet atmosphere to ambient temperature.

Examination of the product showed copper in the metallization, i.e. in direct contact with the tungsten, on both surfaces of the substrate which indicated that copper had been a liquid at soak temperature and had migrated through the metallization in the vias and into the metallization on the top side of the substrate. Significant variations in the concentration of copper in the metallization on the top side of the substrate were optically observed which indicated that the shorter individual electrical paths used less copper resulting in excess copper being left on both sides of that connection which appeared to be coated with copper. The sample showed no sag or distortion which could be detected by conventional means. Also, optical observation showed tiny bumps of glass mostly only on the metallization on the top surface obviously having been forced ahead of the displacing copper from the footprint which indicated that 1450° C. was above the transition temperature of the glassy phase of the metallization and that the fluid glass had been replaced with copper. Also, glass was observed in the pores next to the metallization which indicated that these pores had received some of the displaced glassy phase. The electrical resistance of the infiltrated metallization was measured between the same pad on the footprint and its counterpart on the top side of the ceramic substrate and it was determined to be 43 milliohms.

The infiltrated metallization was adherent to the ceramic substrate. The sample was cut and optical examination of its cross-section showed that copper had penetrated through all of the circuits in the sample and was present in or filled most of the interstices of the metallization. This indicated that a significant amount of copper displaced a significant amount of glass in the metallization which would inherently increase the electrical conductivity of the product by at least 100% and illustrates the present process. This example is illustrated in Table I.

All of the examples given in Table I were carried out in substantially the same manner except as shown in Table I and except as noted herein.

In all of the examples, the tungsten was a solid throughout the process.

Sample Type B of Table I had an average electrical resistance of 500 milliohms, as measured between a pair of castellations on the side of the sample, one of which was connected to the metallization of a pad on the footprint and the other to the corresponding finger on the top surface. It was a co-fired, multi-layered ceramic chip carrier, about 0.65 inch square and about 0.08 inch thick. It was comprised of a high alumina ceramic substrate with an adherent, electrically conductive tungsten metallization on both the footprint and top surfaces and also in its vias and interconnects. The substrate was constructed of four layers of ceramic and had 22 circuits. The metallization was about 12.5 microns thick. The composition of the ceramic substrate and the tungsten metallization was the same as in Sample Type A.

The copper ink given in Table I was the same as in Example 1 and was deposited in substantially the same manner as in Example 1.

In Table I, Atmosphere/Heating indicates the atmosphere in which the sample was heated up to the soak or infiltration temperature, and Atmosphere/Soak and Cool indicates the atmosphere in which the sample was heated at the soak temperature for the given time period and in which the sample was furnace-cooled to ambient temperature.

In Table I, Resistance After Treatment shows the resistance of a single circuit of the infiltrated metallization. In Sample Type A the same circuit was tested for resistance as disclosed in Example 1. In Sample Type B the same pair of castellations on the side of the sample were used to measure the resistance of the infiltrated metallization.

EXAMPLES 2–16 of TABLE I

Example 2 was carried out in substantially the same manner as Example 1 except that a wet atmosphere was used throughout the process. There was little or no penetration of copper which indicated that the wet atmosphere may have caused a deleterious effect between the copper and glass.

Example 3 was carried out in substantially the same manner as Example 2 except that Sample Type B was used.

In the Copper-Plated examples of Table I, i.e. Examples 4–7 and 9–13, copper was plated on all of the metallization on the footprint only of each sample. The electroplating was carried out in a conventional manner. The thickness of the copper plating was about the same in each example and was about 5 to 10 mils thick.

In Examples 4 and 5, where a wet atmosphere was used throughout the process, very little or no penetration occurred indicating that the atmosphere may have caused a deleterious effect between the copper and the glass.

In Examples 6–9, upon reaching soak temperature, a wet atmosphere was substituted for the dry atmosphere. Examples 6 to 9 illustrate the present invention and show that the electrical conductivity of the infiltrated circuit tested was increased by a significant amount. Specifically, in Examples 6–8, optical examination of the surfaces of the products as well as their cross-sections showed that copper had infiltrated the metallizations in substantially the same manner as described in Example 1 and that there was direct contact between the copper and tungsten. In Example 9, optical examination of the surface of the product as well as its cross-section showed that copper had fully infiltrated all of the metallization of the sample as evidenced by its copper color. The samples of Examples 6–9 showed no sag or distortion which could be detected by conventional means.

In Example 10 a wet atmosphere was used until reaching 1450° C., and then a dry atmosphere was substituted.

In Examples 11–16, a dry atmosphere was used throughout the process.

Examples 11–15 illustrate the present process and the samples showed no sag or distortion which could be detected by conventional means. Specifically, in examples 11–13, the infiltration of copper into the metallization had significantly improved the electrical conductivity of the circuit tested. In Examples 11–13, optical examination of the surfaces of the products as well as their cross-sections showed that copper had fully infiltrated all of the metallizations of the samples and that copper was in direct contact with the tungsten phase and was present in the interstices of the continuous tungsten phase indicating that copper had been a liquid at soak temperatures. Also, glass was seen in the pores of the substrate next to the metallization which indicated that the soak temperature was above the transition temperature of the glassy phase of the metallization, that the glass was a fluid at soak temperature, and that it had been displaced and replaced with copper.

In Example 14, a 4 mil thick gold foil was deposited on the metallization on the footprint. Optical examination of the surface and cross-section of the product showed that gold had fully infiltrated all of the metallization of the sample, that it was in direct contact with the tungsten phase, and that at the soak temperature gold was a liquid. Glass was observed in the pores of the substrate next to the metallization indicating that at the soak temperature the glassy phase of the metallization was fluid and had been displaced and replaced by gold.

In Example 15, tin shot was deposited on the metallization on the footprint. In those areas where the shot did not roll off, there was good penetration through the vias to the metallization on the top surface of the sample. The penetration and presence of tin in the metallization indicated that tin was liquid at the soak temperature and that the glassy phase of the metallization was fluid and had been displaced and replaced with tin.

In Example 16, a 10 mil thick silver foil was placed on the metallization on the footprint only. The soak temperature was too high and evaporated the silver away.

TABLE I

| Example | Type of Sample | Infiltrating Metal & Source | Atmosphere/ Heating | Atmosphere/ Soak & Cool | Soak Temperature | Soak Time (minutes) | Resistance After Treatment (milliohms) | Penetration |
| --- | --- | --- | --- | --- | --- | --- | --- | --- |
| 1 | A | Copper-Ink | Dry | Wet | 1450 C | 30 | 43 | good |
| 2 | A | Copper-Ink | Wet | Wet | 1450 C | 30 | 170 | very little or none |
| 3 | B | Copper-Ink | Wet | Wet | 1450 C | 30 | 500 | very little or none |
| 4 | A | Copper-Plated | Wet | Wet | 1450 C | 45 | — | none |
| 5 | B | Copper-Plated | Wet | Wet | 1450 C | 45 | 500 | none |
| 6 | B | Copper-Plated | Dry | Wet | 1450 C | 30 | 265 | good |
| 7 | A | Copper-Plated | Dry | Wet | 1450 C | 30 | 65 | good |
| 8 | A | Copper-Ink | Dry | Wet | 1450 C | 30 | 43 | good |
| 9 | B | Copper-Plated | Dry | Wet | 1450 C | 40 | 123 | complete |
| 10 | B | Copper-Plated | Wet | Dry | 1450 C | 30 | no change | none |
| 11 | B | Copper-Plated | Dry | Dry | 1450 C | 30 | 160 | complete |
| 12 | B | Copper-Plated | Dry | Dry | 1525 C | 60 | 155 | complete |
| 13 | B | Copper-Plated | Dry | Dry | 1525 C | 35 | 167 | complete |
| 14 | B | Gold-Foil | Dry | Dry | 1475 C | 20 | 270 | complete |
| 15 | B | Tin-Shot | Dry | Dry | 1475 C | 20 | 145 | hit or miss |
| 16 | B | Ag-Foil | Dry | Dry | 1475 C | 20 | 500 | Ag evaporated |

EXAMPLE 17

Four sheets, each comprised of 96 squares of Sample Type A disclosed in Example 1, were used. All of the circuits in each sheet were interconnected. A commercially available organic laquer was coated on the top surface to prevent electroplating thereon. Copper was electroplated on the metallization on the footprint of each sheet in a conventional manner for a given time period. The laquer was then dissolved from the top surface by soaking the product in acetone. All of the sheets were positioned substantially vertically in a molybdenum support. Specifically, the configuration of the support was that of an upside-down table with a number of spaced legs which formed open slots. Each sheet was placed in a slot so that it was about 2 degrees from the vertical. This provided a downward force on the weight of each sheet which prevented it from sagging. All of the sheets were heated to an infiltration temperature of 1450° C. where they were held for 45 minutes and then furnace cooled to ambient temperature. Only a dry atmosphere estimated to have a dew point of 0° C. or lower at ambient pressure was used and is shown in Table II.

The results are shown in Table II.

TABLE II

| Sheet | Copper Electroplating Time (minutes) | Average Copper Thickness (mils) | Atmosphere (vol %) | Resistance After Treatment (milliohms) | Penetration |
|---|---|---|---|---|---|
| #1 | 30 | 2 | 10% $H_2$ 90% $Ar_2$ | 55 | complete |
| #2 | 40 | 2.5 | " | 37 | complete |
| #3 | 50 | 3 | " | 45 | complete |
| #4 | 60 | 3.5 | 10% $H_2$ 90% $N_2$ | 50 | complete |

Optical examination of the surfaces of the infiltrated sheets as well as their cross-section showed that copper had infiltrated uniformly or substantially uniformly throughout the metallization and that it was in direct contact with the tungsten. This indicates that 1450° C. was above the transition temperature of the glass in the metallization and that the fluid glass had been displaced and replaced with copper. None of the sheets showed any sag or distortion which could be detected by conventional means. Also, glass was observed in the pores of the substrate next to the metallization which apparently received some of the displaced glass.

The average resistance of two sheets substantially similar to the starting sheets used in this example was measured in the same way and in the same place as the resistance after treatment shown in Table II and found to be 114 and 131 milliohms. A comparison of these values with those in Table II illustrates the significant reduction in resistance provided by the present process.

EXAMPLE 18

In this example, a copper infiltrated sample was prepared substantially in the same manner as disclosed in Example 17. Optical examination of the infiltrated metallization showed that there were tiny bumps of glass on the surface of the metallization on the top side of the sample but none were seen on the metallization on the footprint.

The product was immersed in an aqueous 2% hydrofluoric acid solution at room temperature for about 2 minutes, then rinsed with water and dried. Optical examination of the metallization showed that the bumps of glass had been removed.

The product, i.e. metallization, was then plated in a conventional manner with nickel, about 1 cm thick, and then with gold, about 3 $\mu$m thick.

Two aluminum wires, one 1.2 mils in diameter and the other 2 mils in diameter, were then diffusion bonded to the metallization on the top side of the sample, i.e. to the fingers. The wires were then pulled away from the metallization and broke apart leaving the metallization adherent to the surface.

EXAMPLE 19

A series of tungsten metallized, three-layer chip carriers, on which all the exposed metallization surfaces were plated with nickel only (i.e. as received), were used in this example. Specifically, each carrier was the same and was comprised of ceramic substrate with adherent tungsten metallization plated with nickel. The substrate was comprised of about 91% by weight alumina, about 15% by volume glass and contained minor amounts of silica, magnesia and calcia. The substrate had a porosity of about 7% by volume with pores ranging from about 5$\mu$ to about 25$\mu$ in diameter. The pores were distributed throughout the substrate and a significant number of them were present in the external surface portion of the substrate next to the tungsten metallization. The tungsten metallization was about 18 microns thick and was comprised of an intermixture of continuous phases of tungsten and glass. The tungsten metallization was comprised of roughly about 60% by volume tungsten and the balance was glass and it may have contained some pores. It had an average electrical conductivity of about 0.132 millimhos per square.

Each carrier was placed on a molybdenum plate so that a face of the carrier was supported by the flat surface of the plate and heated to a given temperature for a given time period in a dry hydrogen atmosphere with a dew point of −30° C. at ambient pressure and then furnace cooled to ambient pressure.

Optical examination of the sample which had been fired at 1250° C. for one hour as well as the sample which had been fired at 1350° C. for one hour showed no penetration of the tungsten metallization with nickel.

Optical examination of the sample which had been fired at about 1450° C. for 30 minutes showed that nickel had penetrated all internal and external tungsten metallizations displacing and replacing the glass therein. This indicated that the nickel was a liquid at the firing temperature and the glassy phase of the metallization was fluid. No sagging of the substrate was detectable by conventional means. Specifically, except for the vias, the nickel had displaced and replaced virtually all of the glassy phase of the tungsten metallization as was evident from its nickel color. Glass was seen in the pores of the substrate next to the metallization indicating that the pores had received some of the displaced glass. Penetration and glass displacement by the nickel was also observed in the vias of this part but complete or substantial filling of the vias with nickel was not possible due to the presence of alumina body material used in vias filling tungsten ink screening.

EXAMPLE 20

A section of a tungsten metallized, three-layer (20 mils/layer) chip carried containing a 19 millimeter straight buried trace tungsten metallization with side branches was used. The carrier was comprised of a ceramic substrate and adherent tungsten metallization. The ceramic substrate was substantially of the same type disclosed in Example 19, i.e. it was comprised of about 91% by weight alumina and about 15% by volume glass and had a porosity of about 7% by volume. The buried tungsten metallization trace was about 18$\mu$ thick and 400$\mu$ wide and was comprised of an intermixture of continuous phases of about 60% by volume tungsten and about 40% by volume glass.

The carrier was electroplated in a conventional manner with nickel about 0.1 mm thick, on the metallization on the external surfaces where the buried trace side branches were intersected and cut by diamond saw sectioning. After measurement of the electrical resistance of the straight buried trace (363 milliohms corresponding to 0.132 miliohms per square), the sample was placed on the flat surface of a molybdenum plate and heated to 1450° C. in dry hydrogen with a dew point of −30° C., held at 1450° C. for about one-half hour, and then furnace cooled to ambient. No sagging of the sample was detectable by conventional means. Optical examination of the sample showed that excess surface nickel balled up and exuded glass was evident which attached the Ni balls to the surfaces of the sample at trace exit points indicating that at the firing temperature the nickel was fluid and the glassy phase of the metallization was fluid. Polishing of the side branch metallizations at their exit points showed that complete glass displacement and Ni metal substitution had been achieved. Subsequent electrical measurements and analyses of the long trace conductivity showed that the trace electrical conductivity had been increased by 31% from the value in the initial glass bonded state (i.e. from 0.132 milliohms per square to 0.172 miliohms per square).

What is claimed is:

1. A process for increasing the electrical conductance of a metallization on a ceramic substrate which comprises providing a ceramic substrate with an adherent electrically conductive refractory metal metallization wherein at least one portion of said metallization is exposed, said metallization being comprised of an intermixture of a continuous phase of refractory metal and a continuous phase of glass, said refractory metal ranging from about 25% by volume to about 65% by volume of said metallization, contacting said refractory metal at at least one exposed portion of said metallization with an intrusion metal selected from the group consisting of copper, nickel, tin, gold, iron, cobalt, and alloys thereof, heating the resulting structure to an infiltration temperature which is above the transition temperature of said glass and at which said intrusion metal is liquid but said refractory metal is solid thereby infiltrating said liquid intrusion metal into said metallization, at said infiltration temperature said liquid metal preferentially wetting said refractory metal displacing said glass with said intrusion metal, and allowing the resulting structure to cool thereby solidifying said infiltrated liquid intrusion metal in place, said solid infiltrated intrusion metal at least partly occupying the volume space originally occupied by said displaced glass and being in contact with said refractory metal phase, said process being carried out in an atmosphere which has no significant deleterious effect on said ceramic substrate, said refractory metal metallization and said intrusion metal.

2. The process according to claim 1 wherein said refractory metal is selected from the group consisting of tungsten and molybdenum.

3. The process according to claim 1 wherein said intrusion metal is contacted with said refractory metal by electroplating it onto at least a portion of said metallization.

4. The process according to claim 1 wherein said intrusion metal is contacted with said refractory metal by electroless plating it onto at least a portion of said metallization.

5. The process according to claim 1 wherein said infiltration temperature ranges from higher than about 1300° C. to less than about 1550° C.

6. The process according to claim 1 wherein said electrical conductance is increased by at least 10%.

7. The process according to claim 1 wherein said atmosphere is at ambient pressure.

8. The process according to claim 1 wherein said atmosphere has a dew point of at least 0° C. or lower.

9. The process according to claim 1 wherein said ceramic substrate contains at least about 1% by volume of a glassy phase and is selected from the group consisting of alumina, aluminum nitride, mullite cordierite composites and silicon nitride.

10. The process according to claim 1 wherein said intrusion metal is contacted with said refractory metal by depositing it in the form of a suspension of particles of said intrusion metal onto at least a portion of said metallization.

11. A process for increasing the electrical conductance of a metallization on a ceramic substrate which comprises providing a ceramic substrate with an adherent electrically conductive refractory metal metallization wherein at least one portion of said metallization is exposed, said metallization being comprised of an intermixture of a continuous phase of refractory metal selected from the group consisting of tungsten and molybdenum, and a continuous phase of glass, said refractory metal ranging from about 25% by volume to about 65% by volume of said metallization, contacting said refractory metal at at least one exposed portion of said metallization with copper, heating the resulting structure to an infiltration temperature which is above the transition temperature of said glass and at which said copper is liquid thereby infiltrating said liquid copper into said metallization, at said infiltration temperature said liquid copper preferentially wetting said refractory metal and displacing said glass, and allowing the resulting structure to cool thereby solidifying said infiltrated liquid copper in place, said solid infiltrated copper at least partly occupying the volume space originally occupied by said displaced glass and being in contact with said refractory metal phase, said process being carried out in a dry atmosphere having a dew point of 0° C. or lower which has no significant deleterious effect on said ceramic substrate, said refractory metal metallization and said copper.

12. The process according to claim 11 wherein said copper is contacted with said refractory metal by electroplating.

13. The process according to claim 11 wherein said copper is contacted with said refractory metal by electroless plating.

14. The process according to claim 11 wherein said electrical conductance is increased by at least 10%.

15. The process according to claim 11 wherein said electrical conductance is increased by at least 100%.

16. The process according to claim 11 wherein said atmosphere is at ambient pressure.

17. The process according to claim 11 wherein said ceramic substrate contains at least about 1% by volume of a glassy phase and is selected from the group consisting of alumina and aluminum nitride.

18. The process according to claim 11 wherein said copper is contacted with said refractory metal by depositing it in the form of a suspension of particles of said copper onto at least a portion of said metallization.

* * * * *